United States Patent [19]

Shu

[11] Patent Number: 5,302,489

[45] Date of Patent: Apr. 12, 1994

[54] POSITIVE PHOTORESIST COMPOSITIONS CONTAINING BASE POLYMER WHICH IS SUBSTANTIALLY INSOLUBLE AT PH BETWEEN 7 AND 10, QUINONEDIAZIDE ACID GENERATOR AND SILANOL SOLUBILITY ENHANCER

[75] Inventor: Suisheng J. Shu, Newark, Del.

[73] Assignee: E. I. Du Pont de Nemours and Company, Wilmington, Del.

[21] Appl. No.: 784,355

[22] Filed: Oct. 29, 1991

[51] Int. Cl.$^5$ .................... G03F 7/023; G03C 1/61
[52] U.S. Cl. ..................... 430/191; 430/165; 430/190; 430/192
[58] Field of Search ............. 430/190, 191, 192, 165

[56] References Cited

U.S. PATENT DOCUMENTS

| | | |
|---|---|---|
| 4,009,033 | 2/1977 | Bakos et al. |
| 4,626,492 | 12/1986 | Eilbeck ............... 430/191 |
| 4,650,745 | 3/1987 | Eibeck ............... 430/326 |
| 4,738,915 | 4/1988 | Komine et al. ............... 430/191 |
| 4,745,045 | 5/1988 | Fredericks et al. ............... 430/191 |
| 4,863,828 | 9/1989 | Kawabe et al. ............... 430/191 |
| 4,880,722 | 11/1989 | Moreau et al. ............... 430/192 |
| 5,024,922 | 6/1991 | Moss et al. ............... 430/192 |
| 5,104,768 | 4/1992 | Sassmannshausen et al. ...... 430/192 |

FOREIGN PATENT DOCUMENTS

| | | |
|---|---|---|
| 0300326 | 1/1989 | European Pat. Off. |
| 0301332 | 2/1989 | European Pat. Off. |
| 0402141 | 12/1990 | European Pat. Off. |

Primary Examiner—Charles L. Bowers, Jr.
Assistant Examiner—Christopher G. Young

[57] ABSTRACT

A positive working photoresist composition based on a polyimide or polyimide precursor, a photoactivatable acid generator, and an additive compound, preferably an aromatic silanol, capable of promoting dissolution of the photoactivated portion of the resist, while it has no effect on the rest portion of the resist. Also, a method of patterning the photoresist composition.

6 Claims, No Drawings

POSITIVE PHOTORESIST COMPOSITIONS CONTAINING BASE POLYMER WHICH IS SUBSTANTIALLY INSOLUBLE AT PH BETWEEN 7 AND 10, QUINONEDIAZIDE ACID GENERATOR AND SILANOL SOLUBILITY ENHANCER

FIELD OF THE INVENTION

This invention relates to positive working photoresists. More particularly it pertains to photoresists containing resin, such as a polyimide precursor or a soluble polyimide, a photoactivatable acid generator, and a solubility enhancer, capable of promoting dissolution of the photoactivated portion of the resist, while it has no effect on the rest portion of the resist.

BACKGROUND OF THE INVENTION

Positive working photoresists are known in the art. They generally comprise film-forming polymeric resin binder containing a photoactive compound. The resin binders most frequently used are made from phenol-formaldehyde condensation products, such as Novolak for example. Positive resists are prepared using the novolak type resin by incorporating therein a photoactive compound, for instance, one of the group of the 4- or 5-substituted diazonaphthoquinone (1,2)-diazide sulfonic acid esters. The alkali soluble novolak resins, when mixed with a photoactive acid-generating compound, become insoluble in aqueous alkaline solutions. However, areas exposed to actinic radiation become soluble to these alkaline solutions, called developers, as acidic groups are generated.

Positive resists are most often used as masks to protect substrates from chemical etchants in the manufacture of semiconductors. In such manufacture, the photoresist is coated onto the surface of a semiconductor substrate, and then imaged and developed to remove areas subjected to actinic radiation. The resist image remaining on the surface of the substrate is usually employed as a protective mask to facilitate the selective etching of the exposed portions of the substrate thereby defining a circuit pattern.

Etching of the substrate may be conventionally carried out by chemical treatment, or by dry etching, e.g. reactive ion etching with chemically active gas ions, such as fluorocarbon species for example, formed by glow discharge. Additionally, modern techniques for processing semiconductors may call for plasma and sputter etching, ion beam implantation, and the like.

One of the problems associated with these techniques is that many resist materials cannot withstand the process severity and are eroded along with the substrate, or flow due to reaction with the gaseous ions and the rather high temperatures often encountered on the semiconductor substrate (typically above 200° C.) resulting in loss of pattern resolution. For example, many novolak type phenol formaldehyde resins begin to flow at temperatures around 120° C. and erode when struck by the gas stream generated during reactive ion etching.

When photoresist compositions are employed as dielectric layers, not only thermal stability is essential, but the resist must also maintain good dielectric and mechanical properties.

Over the years, polyamic acid resins produced by condensation of an aromatic dianhydride and an aromatic diamine have received widespread attention as polymeric binders for photoresist compositions because they are readily converted by heat to thermally stable polyimides with very balanced mechanical and dielectric properties. However, the use of polyamic acids has been restricted for the most part to negative working photoresist compositions because of their high solubility in alkaline solutions.

Several problems associated with the use of negative working polyimide photoresists for imageable dielectric layers could be overcome if positive working photoresists were used. In the first place, dielectric applications commonly require that holes be patterned in the existing coating. Hole patterning is most effectively accomplished through the use of a positive resist, in which the exposed areas are removed. In addition, a slight side slope is desired in order to achieve effective metal contacts. Positive resist naturally achieve the necessary sloping sidewalls because the top of the film receives a higher exposure than the bottom of the film, and is therefore slightly more soluble. A third advantage of positive resist over negative resist is due to the fact that the spec of dust on photomask is not so critical. Higher manufacture yield due to lower defects can be improved with positive working polyimide. Positive working resists are also distinguished, as compared to negative resist, by high resolution due to less image swelling, the ability to utilize aqueous developers, which is of importance ecologically and economically, and by the fact that the presence of oxygen has no effect on the exposure time.

Attempts have been made to prepare positive working polyamic acid based compositions using diazoquinone-(1,2)-diazide-sulfonic acid esters such as disclosed in U.S. Pat. No. 4,880,722, among others. Thus, attempts have been made in the past to render the polyamic acid resin insoluble in an alkaline developer by admixture with a orthonaphthoquinone diazide compound. It was believed that sufficient quantities of the diazide compound would render the unexposed areas of the photoresist composition completely insoluble in aqueous alkaline developing solution because of the hydrophobicity and insolubility of the diazides themselves before photolysis or photoimage development. By use of this different solubility, it was believed that sharp distinction between imagewise exposed and unexposed areas during development would occur and thus ensure that only exposed areas would be dissolved in the developer; while unexposed areas would remain insoluble and unaffected in the developer. However, such attempts have had only limited success in that polyamic acid based photoresist systems exhibit such high dissolution rate in conventional commercially available alkaline solutions such as tetramethyl ammonium hydroxide, that adequate control over the process to obtain high resolution can only be achieved with weak alkaline developers such as dilute (0.5%) diethylethanolamine, for example.

Attempts to decrease the dissolution rate of the polyamic acid photoresist precursor, by increasing the concentration of the photoactive compound in the photoresist, e.g. up to about 50% by weight, increase the optical density of the photoresist to such a high extent, that full penetration of the film thickness by a radiation source is unattainable for all practical purposes.

In U.S. Pat. No. 4,880,722 (Moreau, et al.), it is disclosed that the dissolution rate in alkaline developers of image-wise exposed photoresist systems based on diazoquinone sensitized polyamic acid is reduced to prepare relief images of fine line resolution by reducing the acidity of the polyamic acid prior to exposure. This reduction in acidity is achieved by pre-baking the coating to partially imidize the polyamic acid to a level of 20% imidization; or partial neutralization with basic organic reagents; or the use of blends of the polyamic acid with its ester derivatives or with copolymers of the acid and its ester. However, pre-baking to achieve partial imidization above 100° C., as for example at even 120° C., causes loss of photosensitivity due to degradation of the diazoquinone photosensitizers. Furthermore, acidity reduction through employment of basic organic reagents, therein disclosed, tends to promote corrosion of the conductors found in integrated circuits. Blends of polyamic acid with its ester derivatives tend to cause phase separation during pre-baking process.

In addition, resist formulations which contain polyamic acids and diazoquinone compounds have limited storage life, since diazoquinone compounds tend to decompose in the presence of acid.

U.S. Pat. No. 4,863,828 (Kawabe et al.) discloses a positive working photoresist composition, which comprises a light sensitive substance of 1,2-naphthoquinonediazide-4-and/or -5-sulfonate of 2,3,4,3',4',5'-hexahydroxybenzophenone and an alkali soluble novolak resin dissolved in ethyl lactate or methyl lactate. This reference also discloses that the composition may further contain a polyhydroxy compound for accelerating dissolution of the composition into a developer, in a preferable amount of 0.2 to 5% by weight based on the solid contents of the composition.

U.S. Pat. No. 4,738,915 (Komine et al.) discloses positive-working photoresist compositions comprising a novolac resin and an ester compound between 2,3,4-trihydroxybenzophenone and naphthoquinone-1,2-diazido-5-sulfonic acid. In addition, the composition contains a specified amount of 2,3,4-trihydroxybenzophenone in a specified amount relative to the ester compounds as part of the photosensitive component which may be a reaction product obtained by the esterification reaction for the synthesis of the ester compounds containing unesterified 2,3,4-trihydroxybenzophenone.

U.S. Pat. Nos. 4,626,492 and 4,650,745 (Eilbeck) disclose a composition and a method, respectively, pertaining to a positive resist which is claimed to demonstrate improved photospeed and rate of development. The resist composition contains a solvent and select proportions of a novolac resin, a naphthoquinone diazide sensitizer, a dye which absorbs light and an effective proportion of a trihydroxybenzophenone compound.

U.S. Pat. No. 4,009,033 (Bakos et al.) discloses a positive photoresist which is claimed to have increased sensitivity to light, and which is formed by the addition of an acidic compound to a 1,2-quinone-diazido-sulfonic acid ester sensitizer.

In contrast to the present invention, as it will be explained in detail hereinbelow, none of the above references discloses, suggest or implies the combination of an alkali insoluble resin of the polyimide or polyimide-precursor type with an acid generator and an additive compound, used to enhance solubility, in an amount of 25-50 parts (preferably 30-40 parts) of said compound per 100 parts of resin.

SUMMARY OF THE INVENTION

The instant invention is directed to a positive working photoresist. More particularly it pertains to a positive photoresist composition comprising:

(a) 100 parts by weight of a resin selected from the group consisting of a polyimide precursor and a polyimide, the resin being substantially insoluble in alkaline media at a pH between 7 and 10, but soluble at a level of at least 2% by weight in at least one solvent selected from the group consisting of dimethylsulfoxide, diethylsulfoxide, N,N-dimethylformamide, N,N-diethylformamide, N,N-dimethylacetamide, N,N-diethylacetamide, N-cyclohexyl-2-pyrrolidone, 1,3-dimethyl-2-imidozolidione, N-methyl-2-pyrrolidone, phenol, o-, m-, p-cresol, xylenol, halogenated phenol, catechol, hexamethylphosphoramide, g-butyrolactone, chloroform, tetrachloroethane and a mixture thereof;

(b) 25-50 parts by weight of an acid generator, the acid generator being activatable by actinic radiation;

(c) 25-50 parts by weight of a solubility enhancer, the solubility enhancer being substantially non-volatile under 110° C., and soluble in alkaline media at a pH greater than 7.5; and (d) a common solvent to the resin, the acid generator and the solubility enhancer.

It is preferable that the solubility enhancer comprises a hydroxyl group, more preferable that it is selected from the group consisting of 4,4'-Biphenol
Bis(4-hydroxyphenyl)methane
Tris-(2-hydroxyethyl)isocyanurate
2,2',4,4'-Tetrahydroxybenzophenone
Quinalizarin (1,2,5,8-tetrahydroxyanthraquinone)
Bis(2-hydroxyphenyl)methane
2,3,4-Trihydroxybenzophenone
2,4,4'-Trihydroxybenzophenone
2',3',4'-Trihydroxyacetophenone
2,3,4-Trihydroxybenzaldehyde
Pyrogallol (1,2,3-trihydroxybenzene)
2',4',6'-Trihydroxy-3-(4-hydroxyphenyl) propiophenone
2,2'-Biphenol
Phenol Red
1,5-dihydroxyanthraquinone
2,6-dihydroxyanthraquinone
Tetrahydroxy-1,4-benzoquinone, and
HO—C6H4—R—C6H4—OH, where —R— is =C(CH3)2, or
=C(CF3)2or=SO2, and even more preferable that it is selected from the group consisting of 2,2',4,4'-Tetrahydroxybenzophenone
Tris-(2-hydroxyethyl)isocyanurate
4,4'-Biphenol It is further preferable that the solubility enhancer comprises a silanol, preferably selected from the group consisting of triphenylsilanol, diphenylsilanediol, 1,4-bis(hydroxydimethylsilyl)benzene, and 1,3-bis(4-hydroxybutyl)tetramethyldisiloxane. More preferably, the silanol comprises diphenylsilanediol.

Very desirable is a requirement that a 5 micrometer thick film of the photoresist composition on a silicon wafer, which film has been baked at 100° C. for ½ hour, dissolves in less than 5 minutes in a 2.4% by weight solution of tetramethylammonium hydroxide in water.

The solubility enhancer may also be a monomeric acid, preferably benzoic or sulfonic acid.

The resin is preferably an esterified polyamic acid.

The acid generator is preferably selected from the group consisting of the product of condensation of naphthoquinone-(1,2)diazide-(5)-sulfonic acid with 2,3,4-trihydroxybenzophenone, and the product of condensation of naphthoquinone-(1,2)diazide-(4)-sulfonic acid with 2,3,4-trihydroxybenzophenone.

The common solvent preferably comprises a solvent selected from the group consisting of dimethylsulfoxide, diethylsulfoxide, N,N-dimethylformamide, N,N-diethylformamide, N,N-dimethylacetamide, N,N-diethylacetamide, N-methyl-2-pyrrolidone, N-cyclohexyl-2-pyrrolidone, 1,3-dimethyl-2-imidozolidione, N-methyl-2-pyrrolidone, phenol, o-, m-, p-cresol, xylenol, halogenated phenol, catechol, hexamethylphosphoramide, g-butyrolactone, chloroform, tetrachloroethane and a mixture thereof.

The present invention also pertains to a positive photoresist composition comprising:

(a) 100 parts by weight of a base polymer, the base polymer being substantially insoluble in alkaline media at a pH between 7 and 10;

(b) 25–50 parts by weight of an acid generator, the acid generator being activatable by actinic radiation;

(c) 25–50 parts by weight of a silanol, the silanol being non-volatile under 110° C., and soluble in alkaline media at a pH greater than 7.5; and (d) a common solvent to the base polymer, the acid generator and the silanol.

Preferably, the base polymer is selected from the group consisting of acrylic, methacrylic, polyester, polystyrene, polycarbonate, novolac resin, esterified epoxy, polyurethane, polyurea, and a mixture thereof. Depending on the particular base polymer, the common solvent in this case should be such that dissolves all components of the compositions. A person of ordinary skill in the art is capable of easily selecting an appropriate solvent.

It is also preferable that the silanol comprises diphenylsilanediol.

A very preferred positive photoresist composition comprises:

(a) 100 parts by weight of a polyamic ethyl ester prepared by condensation of diethyl pyromellitate diacyl chloride with 4,4'-oxydianiline;

(b) 30–40 parts by weight of an acid generator, the acid generator being a product of condensation of naphthoquinone-(1,2)diazide-(5)-sulfonic acid with 2,3,4-trihydroxybenzophenone;

(c) 30–40 parts by weight of diphenylsilanediol; and (d) 350–450 parts by weight of a common solvent to the ethyl ester, the acid generator, and the diphenylsilanediol, the common solvent comprising N-methyl-2-pyrrolidone and N-cyclohexyl-2-pyrrolidone.

Further, the present invention pertains to a method of forming a positive photoresist pattern on a substrate comprising the steps of:

(i) applying on a substrate a positive photoresist composition comprising (a) 100 parts by weight of a polyimide precursor, the precursor being substantially insoluble in alkaline media at a pH between 7 and 10, but soluble at a level of at least 2% in at least one solvent selected from the group consisting of dimethylsulfoxide, diethylsulfoxide, N,N-dimethylformamide, N,N-diethylformamide, N,N-dimethylacetamide, N,N-diethylacetamide, N-cyclohexyl-2-pyrrolidone, 1,3-dimethyl2-imidozolidione, N-methyl-2-pyrrolidone, phenol, o-, m-, p-cresol, xylenol, halogenated phenol, catechol, hexamethylphosphoramide, g-butyrolactone, chloroform, tetrachloroethane and a mixture thereof;

(c) 25–50 parts by weight of an acid generator, the acid generator being activatable by actinic radiation;

(c) 25–50 parts by weight of a solubility enhancer, the solubility enhancer being substantially non-volatile under 110° C., and soluble in alkaline media at a pH greater than 7.5; and (d) a common solvent to the polyimide precursor, the acid generator and the solubility enhancer.

(ii) evaporating the majority of the common solvent to substantially dry the photoresist;

(iii) imagewise exposing the dried photoresist to actinic radiation, the radiation being capable of photoactivating the acid generator; and (iv) removing the photoactivated portions of the photoresist with an alkaline developer.

Preferably, the method further comprises a step of subjecting the developed photoresist to an effective amount of heat and temperature in order to induce imidization of the resin.

DETAILED DESCRIPTION OF THE INVENTION

As indicated above, there is a strong need in the art for a system which provides good control and broad development latitude of photoresists without reducing their sensitivity and resolution characteristics.

This invention resolves the vexing problems encountered in the composition of positive working polyimide photoresists by judicially selecting the components, amounts, and relationship among these components.

According to the present invention, a resin or base polymer is used which is substantially insoluble in alkaline media at a pH between 7 and 10, but soluble at a level of at least 2% by weight in a polar solvent as discussed earlier in the summary of the invention.

In combination with the resin, an acid generator being activatable by actinic radiation is employed at a level 25–50, preferably 30–40, and even more preferably 33–37 parts by weight per 100 parts of resin or base polymer.

Further, the composition of the present invention also comprises a solubility enhancer, which is substantially non-volatile under 110° C., and soluble in alkaline media at a pH greater than 7.5. The solubility enhancer is also employed at a level 25–50, preferably 30–40, and even more preferably 33–37 parts by weight per 100 parts of resin or base polymer. Amounts smaller than 25 parts are ineffective, while larger than 50 parts produce undesirable results, such as partial dissolution of the unexposed portions of the resist, as well as degradation of its mechanical and/or electrical properties, and the like.

Finally, a common solvent to the resin, the acid generator and the solubility enhancer is used to provide a solution suitable for application on wafers or other electronic devices.

The resin or base polymer may have any structure which gives it the aforementioned solubility characteristics, as long as the molecular weight is high enough to provide good integrity and film forming capability. Examples are alkali-insoluble but solvent-soluble polyimides and other polyimide precursors, such as esterified polyamic acids to an adequate degree to attain the "alkali-insoluble" status. The insolubility in alkaline media is very important, because the unexposed regions of the resist remain insensitive to the alkaline developer. In contrast, formulations containing soluble polyamic acids yield unexposed regions which are very sensitive to the alkaline developers, and thus the development latitude becomes very narrow. This is because the dissolution rate of the exposed regions of the resist is competing against the dissolution rate of the unexposed regions, and the difference of the two rates determines the development latitude. In contrast, the development latitude of an insoluble resin is considerably higher.

Solvent-soluble polyimides are alkali-insoluble, as they do not contain any groups, such as for example carboxyl groups, which would tend to solubilize the resin in alkaline media. Examples of preferred polyimides are 6FDA/MPD, 6FDA/ODPA/ODA, and PXDA/MPD. (abbreviations are listed in the glossary below). When polyimides are used, the imaged patterns can be postbaked at relatively low temperature such as 200° C. to remove any residual solvent, while in the case of esterified polyamic acids or other types of polyimide precursors, usually higher temperatures have to be employed, of the order of 300°-450° C.

The esterified polyamic acids according to this invention are preferably esterified with lower molecular weight alcohols, such as for example methyl, ethyl, propyl, isopropyl, butyl, t-butyl, other isobutyl and the like. Other alcohols may, of course, be also be used, such as for example the unsaturated esters of glycol monoallyl ether or 2-hydroxyethyl methacrylate known from the German Patent 2,437,348. The lower molecular weight alcohols are preferred as leaving behind lower amounts of residues during imidization of the precursor. Preferred esterified polyamic acids are polyamic ethyl esters prepared by condensation of diethyl pyromellitate diacyl chloride with 4,4'-oxydianiline.

Use of polyimides or their precursors is highly preferable as compared to other polymers because they can withstand harsh processing conditions in the final imide form, as well as because the unexposed portions of the film may play the role of a dielectric or an insulator, and remain as an active component in the final circuit configuration.

Examples of dianhydrides, which may be involved in the structure of the precursors or polyimides of the present invention are:

2,2-bis(3,4-dicarboxyphenyl)hexafluoropropane dianhydride, pyromellitic anhydride, 1,4,5,8-naphthalenetetracarboxylic dianhydride, 2,3,6,7-naphthalenetetracarboxylic dianhydride, 3,3',4,4'-biphenyltetracarboxylic dianydride, 1,2,5,6-naphthalenetetracarboxylic dianhydride, 2,2'3,3'-biphenyltetracarboxylic dianhydride, 3,3',4,4'-benzophenonetetracarboxylic dianhydride, 2,2-bis(3,4-dicarboxyphenyl)propane dianhydride, bis(3,4-dicarboxyphenyl)sulfone dianhydride, 3,4,9,10-perylenetetracarboxylic dianhydride, 1,1-bis(2,3-dicarboxyphenyl)ethane dianhydride, 1,1-bis(3,4-dicarboxyphenyl)ethane dianhydride, bis(2,3-dicarboxyphenyl)methane dianhydride, bis(3,4-dicarboxyphenyl)methane dianhydride, oxydiphthalic dianhydride, 9-trifluoromethyl-9-phenyl-2,3,6,7-xanthenetetra-carboxylic dianhydride, 9,9-bis(trifluoromethyl)xanthenetetra-carboxylic dianhydride, 12,14-(R)2-12,14-(Rf)2-12H,14H-5,7-dioxa-2,3,9,10-pentacenetetracarboxylic acid dianhydride (wherein R is selected from the group consisting of aryl, substituted aryl, and perfluoroalkyl, and Rf is perfluoroalkyl), and mixtures thereof.

Examples of diamines, which may be involved in the structure of the precursors or polyimides of the present invention are:

bis(4-aminophenyl)ether, 4,4'-diamino-3,3'-dimethylbiphenyl, 4,4'-diamino-3,3'-dimethoxybiphenyl, 4,4'-bis(4-aminophenoxy)biphenyl, 4,4'-diaminodiphenylsulfone, 3,3'-diaminodiphenylsulfone, bis[4-(4-aminophenoxy)phenyl]sulfone, bis[4-(3-aminophenoxy)phenyl]sulfone, bis[4-(2-aminophenoxy)phenyl]sulfone, 1,4-bis(4-aminophenoxy)benzene, 4,4'-diamino-2,2'-dichloro-5,5'-dimethoxybiphenyl, 4,4'-diamino-2,2',5,5'-tetrachlorobiphenyl, 9,10-bis(4-aminophenyl)anthracene, o-tolidine sulfone, 1,3-bis(4-aminophenoxy)benzene, 1,3-bis(3-aminophenoxy)benzene, 1,4-bis(4-aminophenyl)benzene, [4-(4-aminophenoxy)phenyl]ether, bis(4-aminophenyl)methane, bis(4-amino-3-ethylphenyl)methane, bis(4-amino-3-methylphenyl)methane, bis(4-amino-3-chlorophenyl)methane, bis(4-aminophenyl)sulfide, bis(3-aminophenyl)ether, 3,4'-diaminodiphenyl ether, 4,4'-diaminooctafluorobiphenyl, 1,3-diaminobenzene, 2,2-bis[4-(4-aminophenoxy)phenyl]propane, 2,2-bis[4-(4-aminophenoxy)phenyl]hexafluoropropane, 2,2-bis(4-aminophenyl)propane, 2,2-bis(4-aminophenyl)hexafluoropropane, 2,2-bis(4-amino-3-hydroxyphenyl)propane, 2,2-bis(4-amino-3-hydroxyphenyl)hexafluoropropane, 9,9-bis(4-aminophenyl)-10-hydroanthracene, diaminoanthraquinones (e.g., 1,5-diamino-9,10-anthraquinone and 2,6-diaminoanthraquinone), 4,4'-diamino-3,3'-dichlorobiphenyl, 4,4'-diamino-3,3'-dihydroxybiphenyl, 4,4'-diaminobiphenyl, 9,9-bis(4-aminophenyl)fluorene, bis(3-amino-4-methylphenyl)sulfone, 2-(4-aminobiphenyl)-2-[3-(4-aminophenoxy)phenyl]propane, Bisaniline M, Bisaniline P, bis(4-amino-2,6-methylphenyl)methane, 2,4-diamino-1-isopropylbenzene, 1,4-diamino-2,5-dichlorobenzene, 1,4-diamino-2,6-dichlorobenzene, 1,4-diamino-2,5-dimethylbenzene, 1,4-diamino-2-chlorobenzene, 1,3-diamino-4-chlorobenzene, 1,4-diamino-5-chloro-2-methylbenzene, 6-aceto-2,4-diamino-1,3,5-triazine, 1,4-diamino-2,3,5,6-tetramethylbenzene, 1,3-diamino-2,4,6-trimethylbenzene, bis(3-aminopropyl)tetramethyldisiloxane, 2,7-diaminofluorene, 2,5-diaminopyridine, 1,4-diaminobenzene, 1,2-bis(4-aminophenyl)ethane, 4,4'-diaminobenzanilide, 4-aminophenyl 4-aminobenzoate, 1,5-diaminonaphthalene, 2,4-diaminotoluene, 1,3-diamino-5-trifluoromethylbenzene, 1,3-bis(4-aminophenyl)hexafluoropropane, 1,4-bis(4-aminophenyl)octafluorobutane, 1,5-bis(4-aminophenyl)decafluoropentane, 1,7-bis(4-aminophenyl)tetradecafluoroheptane, 2,2-bis[4-(3-aminophenoxy)phenyl]hexafluoropropane, 2,2-bis[4-(2-aminophenoxy)phenyl]hexafluoropropane, 2,2-bis[4-(4-aminophenoxy)-3,5-dimethylphenyl]hexafluoropropane, 2,2-bis[4-(4-aminophenoxy)-3,5-bis(trifluoromethyl)phenyl]-hexafluoropropane, 1,4-bis(4-amino-2-trifluoromethylphenoxy)benzene, 4,4'-bis(4-amino-2-trifluoromethylphenoxy)biphenyl, 4,4'-bis(4-amino-3-trifluoromethylphenoxy)biphenyl, 4,4'-bis(4-amino-2-trifluoromethylphenoxy)diphenyl sulfone, 4,4'-bis(3-amino-3-trifluoromethylphenoxy)diphenyl sulfone, 2,2-bis[4-(4-amino-3-trifluoromethylphenoxy)phenyl]hexafluoro-propane, 4,4'-diamino-3,3',5,5'-tetramethylbiphenyl, 4,4'-diamino-2,2'-bis(trifluoromethyl)biphenyl, 4,4'-diamino-2,2'-dimethylbiphenyl, 4,4'-diamino-3,3'-dimethylhexafluorobiphenyl, 4,4'''-diaminoquaterphenyl, 1,3-diamino-5-tert-butylbenzene, 1,4-bis(3-aminophenoxy)benzene, bis[4-(3-aminophenyl)phenyl]ether, 4,4'-diamino-2,2'-dichlorobiphenyl, 3,3'-diamino-4,4'-dihydroxybiphenyl, and mixtures thereof.

Examples of photoactivatable acid generators according to the present invention are photoactive compounds (sometimes called light sensitizers), such as for example o-quinonediazide compounds particularly esters derived from polyhydric phenols, alkyl-polyhydroxyphenones, arylpolyhydroxyphenones, and the like which can contain up to six or more sites for esterification, as described in U.S. Pat. Nos. 3,046,118, 3,046,121, 3,106,465, 3,201,239, 3,666,473, as well as 4,837,121, Col. 5 line 55 to Col. 6 line 66. They include resorcinol 1,2-naphthoquinonediazide-4-sulfonic acid esters; pyrogallol 1,2-naphthoquinonediazide-5-sulfonic acid esters, 1,2-quinonediazidesulfonic acid esters of (poly)hydroxyphenyl alkyl ketones or (poly)hydroxyphenyl aryl ketones such as 2,4-dihydroxyphenyl propyl ketone 1,2-benzoquinonediazide-4-sulfonic acid esters, 2,4-dihydroxyphenyl hexyl ketone 1,2-naphthoquinone-diazide-4-sulfonic acid esters, 2,4-dihydroxybenzophenone 1,2-naphthoquinonediazide-5-sulfonic acid esters,2,3,4-trihydrophenyl hexyl ketone, 2-naphthoquinonediazide-4-sulfonic acid esters, 2,3,4-trihydroxy-benzophenone 1,2-naphthoquinonediazide-4-sulfonic acid esters, 2,3,4-trihydroxy benzophenone 1,2-naphthoquinonediazide-5-sulfonic acid esters. 2,4,6-trihydroxybenzophenone 1,2-naphthoquinonediazide-4-sulfonic acid esters, 2,4,6-trihydroxybenzophenone 1,2-naphthoquinone-diazide-5-sulfonic acid esters, 2,2',4,4'-tetrahydroxy-benzophenone 1,2-naphthoquinonediazide-5-sulfonic acid esters, 2,3,4,4'-tetrahydroxy-benzophenone 1,2-naphthoquinonediazide-5-sulfonic acid esters, 2,3,4,4'-tetrahydroxy-benzophenone 1,2-naphthoquinone-diazide-4-sulfonic acid esters, 2,2',2,4', 6'-pentahydroxybenzophenone 1,3-naphthoquinonediazide-5-sulfonic acid esters and 2,3,3',4,4',5'-hexahydroxybenzophenone 1,2-naphthoquinonediazide-5-sulfonic acid esters; 1,2-quinonediazidesulfonic acid esters of bis[-(poly)hydroxyphenyl]alkanes such as bis(p-hydroxyphenyl)-methane 1,2-naphthoquinonediazide-4-sulfonic acid esters, bis(2,4-dihydroxyphenyl)methane 1,2-naphthoquinonediazide-5-sulfonic acid esters, bis(2,3,4-trihydroxyphenyl)methane 1,2-naphthoquinonediazide-5-sulfonic acid esters, 2,2-bis(p-hydroxyphenyl)-propane 1,2-naphthoquinone-diazide-4-sulfonic acid esters, 2,2-bis(2,4-dihydroxyphenyl)propane 1,2-naphthoquinone-diazide-5-sulfonic acid esters and 2,2-bis(2,3,4-tri-hydroxyphenyl)propane 1,2-naphthoquinonediazide-5-sulfonic acid esters, 2,2-bis(p-hydroxyphenyl)-propane 1,2-naphthoquinone-diazide-4-sulfonic acidesters, 2,2-bis(2,4-dihydroxyphenyl)propane 1,2-naphthoquinone-diazide-5-sulfonic acid esters and 2,2-bis(2,3,4-tri-hydroxyphenyl)propane 1,2-naphthoquinonediazide-5-sulfonic acid esters. Besides the 1,2-quinonediazide compounds exemplified above, there can also be used the 1,2-quinonediazide compounds described in J. Kosar, "Light-Sensitive Systems", 339–352 (1965), John Wiley & Sons (New York)or in S. DeForest, "Photoresist", 50, (1975), MacGraw-Hill, Inc. (New York). In addition, these materials may be used in combinations of two or more. Further, mixtures of substances formed when less than all esterification sites present on a particular polyhydric phenol, alkylpolyhydroxyphenone, arylpolyhydroxyphenone and the like have combined with o-quinonediazides may be effectively utilized in positive acting photoresists.

Of all the 1,2-quinonediazide compounds mentioned above, 1,2-naphthoquinonediazide-5-sulfonic acid di-, tri-, tetra-, penta-, and hexa-esters of polyhydroxy compounds having at least 2 hydroxyl groups, i.e. about 2 to 6 hydroxyl groups, are most preferred.

Among these most preferred 1,2-naphthoquinone-5-diazide compounds are 2,3,4-trihydroxybenzophenone 1,2-naphtho-quinonediazide-5-sulfonic acid esters, 2,3,4,4'-tetrahydroxy-benzophenone 1,2-naphthoquinone-diazide-5-sulfonic acid esters, and 2,2',4,4'-tetrahydroxybenzophenone 1,2-naphthoquinonediazide-5-sulfonic acid esters. These 1,2-quinonediazide compounds may be used alone or in combination of two or more.

The solubility enhancer can be a compound which is soluble in alkaline media at some pH higher than 7.5, which obeys the already discussed requirements, and which is compatible with the composition. By being compatible it is meant that it is either soluble in the res of the solid components of the composition after a film has been formed, or at least it is not grossly phase-separated. If micro-phase separation occurs, the separated phase globules should be smaller than the resolution desired, preferably by a factor higher than 2, and more preferably by a factor higher than 5. Since for the solvents to evaporate, the composition in, a film form on the desired substrate is heated usually at a temperature of 100°–110° C., the solubility enhancer has to be non-volatile at this range, so that it will remain in the film to play its role during the development.

It has been found by the Applicant that the solubility enhancer does not solubilize the unexposed part of the resist, if used under the conditions and requirements of the instant invention, while it provides an outstanding solubilizing effect on the exposed portions. It was also unexpected to observe that the properties of the polyimide film suffer very little, and much less of what one would expect. Adjustment of the acid generator in the absence of the solubility enhancer, does not approach the quality of the films, definition, and resolution achieved by the combinations employed in this invention.

A class of highly preferred solubility enhancers includes silanols, preferably selected from the group consisting of triphenylsilanol, diphenylsilanediol, 1,4-bis(-hydroxydimethylsilyl)benzene, and 1,3-bis(4-hydroxybutyl)tetramethyldisiloxane, with special preference to diphenylsilanediol. This is due to the fact that in addition to providing excellent solubility balance between the exposed and unexposed areas, they also provide films of considerably lower water absorption.

Another preferable class is the one encompassing non-volatile compounds containing phenolic hydroxyls. The phenolic hydroxyls have adequate acidity to serve as solubility enhancers effectively, with reduced corrosive nature, as compared to carboxylic hydroxyls.

Acids, salts and other soluble compounds containing aliphatic hydroxyl groups are also useful in the practice of the present invention as solubility enhancers.

Some examples of preferred solubility enhancers, as aforementioned are:
4,4'-Biphenol
Bis(4-hydroxyphenyl)methane
Tris-(2-hydroxyethyl)isocyanurate
2,2',4,4'-Tetrahydroxybenzophenone
Quinalizarin (1,2,5,8-tetrahydroxyanthraquinone)
Bis(2-hydroxyphenyl)methane
2,3,4-Trihydroxybenzophenone
2,4,4'-Trihydroxybenzophenone
2',3',4'-Trihydroxyacetophenone
2,3,4-Trihydroxybenzaldehyde
Pyrogallol (1,2,3-trihydroxybenzene)

2',4',6'-Trihydroxy-3-(4-hydroxyphenyl) propiophenone
2,2'-Biphenol
Phenol Red
1,5-dihydroxyanthraquinone
2,6-dihydroxyanthraquinone
Tetrahydroxy-1,4-benzoquinone, and
HO-C6H4-R-C6H4-OH, where -R- is =C(CH3)2, or =C(CF3)2, or=SO2,
with special preference to
2,2',4,4'-Tetrahydroxybenzophenone
Tris-(2-hydroxyethyl)isocyanurate, and
4,4'-Biphenol Examples of preferred solvents in the practice of this invention, especially in the case of polyimides or their precursors, include, but are not limited to, polar organic solvents, such as sulfoxide type solvents including dimethylsulfoxide, diethylsulfoxide, and the like, formamide type solvents, such as N,N-dimethylformamide, N,N-diethylformamide; acetamide type solvents, including N,N-dimethylacetamide, N,N-diethylacetamide; pyrrolidone type solvents, including N-methyl-2-pyrrolidone, N-cyclohexyl-2-pyrrolidone, 1,3-dimethyl-2-imidazolidinone, N-vinyl-2-pyrrolidone; phenolic solvents, including phenol, o-, m-, and p-cresol, xylenol, halogenated phenol, catechol; hexamethylphosphoramide; and a number of lactones including g-butyrolactones. These solvents may be used alone or as a mixture. Partial use of aromatic hydrocarbons such as xylene and toluene, is also possible, and sometimes desirable.

Where different resins or base polymers are utilized, solvents such as ketones, ethers, alcohols, and the like are also additional examples.

In a different embodiment of this invention, silanols, such as for example diphenylsilanediol may be also used as solubility enhancers in a variety of base polymers, such as for example acrylics, methacrylics, polyesters, polystyrenes, polycarbonates, novolac resins, esterified epoxies, polyurethanes, polyureas, and mixtures thereof.

The method of forming a pattern with the positive photoresist of the present invention on a substrate comprises initially a step of applying the photoresist composition usually by spin coating, dipping, or spraying. The majority of the solvent is then evaporated away at baking temperatures ranging usually between 90° and 110° C. In sequence, the dried photoresist film is imagewise exposed to actinic radiation, which photoactivates the acid generator. Following this step, the photoactivated portions of the photoresist are removed with an alkaline developer, usually by spraying or dipping. Preferably, an additional step is performed, involving heat treatment of the developed film at a temperature usually between 200°-450° C. for removing the rest of the solvent and further or fully imidizing the remaining film, depending on whether the resin was already an imide or a precursor to an imide, respectively.

A good test to determine whether a photoresist made according to the present invention has good dissolution characteristics is to form a film of the photoresist composition on a silicon wafer, which after having been baked at 100° C. for ½ hour has a thickness of 5 micrometers. This film should dissolve in less than 5 minutes when dipped in a 2.4% by weight solution of tetramethylammonium hydroxide in water.

GLOSSARY

CHP: N-cyclohexyl-2-pyrrolidone
6FDA: 2,2'-bis(3,4-dicarboxyphenyl)hexafluoropropane
MPD: Metaphenylenediamine
NMP: N-methyl-2-pyrrolidone
ODA: 4,4'-oxydianiline
ODPA: Oxydiphthalicanhydride
PXDA: 9-phenyl-9'-trifluoromethylxanthene-2,3,6,7-dianhydride
TMAH: Tetramethylammonium Hydroxide

EXAMPLES

This invention will be further illustrated by reference to the following specific examples. All parts, percents, ratios and the like are by weight.

COMPARATIVE EXAMPLES 1 AND EXAMPLES 2-8

The resist solutions were prepared by dissolving diazo sensitizer, polyimide resin and solubility enhancer in a solvent mixture. The materials used and their concentrations are set forth in the following table:

| Formulation | Resin[1] (Grams) | Sensitizer[2] (Grams) | Solubility Enhancer[3] Type | Solubility Enhancer[3] (Grams) | Solvent[4] (Grams) |
|---|---|---|---|---|---|
| A | 50 | 4.4 | — | — | — |
| B | 50 | 4.4 | AA | 0.55 | — |
| C | 50 | 4.4 | AA | 1.10 | — |
| D | 50 | 4.4 | AA | 2.2 | — |
| E | 50 | 4.4 | BB | 4.4 | 5.0 |
| F | 50 | 4.4 | BB | 4.950 | 5.0 |

[1]Resin is a preimidized condensation product (22% solids by weight) of 4,4'-hexafluoroisopropylidene-bis-phthalic anhydride and a mixture of 4,4-oxydianiline (50%) and 4,4'-diaminodiphenyl sulfone (50%) in a solvent mixture composed of 80% N-methyl-2-pyrrolidone and 20% aromatic hydrocarbon.
[2]Sensitizer: Triester formed by condensing naphthoquinone(1,2)diazide-(5)-sulfonic acid with 2,3,4-trihydroxybenzophenone.
[3]Solubility enhancer:
AA: Tris-(2-hydroxyethyl)isocyanurate
BB: 4,4'-Biphenol
[4]Solvent: Propylene glycol methyl ether Each formulation was coated on a silicone wafer which was treated with an aminopropyltriethoxysilane adhesion promoter by means of a spin coating process. The coated wafers were dried for 30 minutes at 90° C. in a convection oven to give a surface film having thickness of 2.5-4.5 μm. The dried wafers were then contact exposed through an Opto-Line multidensity resolution mask. The exposure unit was a Karl Suss contact printer. An exposure time of 30 seconds was used. The wafers were then immersion developed in an aqueous alkaline solution with conditions described in the following table. The wafers were rinse with deionized water and forced air dried. The results and process conditions are set forth in the following table:

| Example | Formulation | Developer[1] | Concentration (%) | Dev. Time (Min) | Clear Dose[2] (mJ/cm$^2$) | Image |
|---|---|---|---|---|---|---|
| 1 | A | TMAH 25° C. | 5 | 4 | 240 | No development |
| 2 | B | MEAM 40° C. | 40 | 3 | 180 | Clear |
| 3 | B | MEAM 45° C. | 50 | 2 | 150 | Clear |
| 4 | C | MEAM 40° C. | 50 | 5 | 180 | Clear |
| 5 | C | MEAM 40° C. | 50 | 3 | 150 | Clear |

-continued

| Example | Formulation | Developer[1] | Concentration (%) | Dev. Time (Min) | Clear Dose[2] (mJ/cm$^2$) | Image |
|---|---|---|---|---|---|---|
| 6 | D | TMAH 40° C. | 9.2 | 2 | 110 | Clear |
| 7 | E | TMAH 40° C. | 2.38 | 2 | 144 | Clear |
| 8 | F | TMAH 40° C. | 2.38 | 1.5 | 144 | Clear |

[1]Developer: MEAM: Monoethanolamine
[2]Clear Dose is defined by the minimum UV energy to clear the complete film thickness The results clearly show the marked improvement in development which is achieved when the select additive is present in the resist composition in accordance with the present invention.

COMPARATIVE EXAMPLES 9 AND EXAMPLES 10-11

The resist solutions were prepared by dissolving diazo sensitizer, polyimide resin and solubility enhancer in a solvent mixture. The materials used and their concentrations are set forth in the following table:

| Formulation | Resin[1] (Grams) | NMP[2] (Grams) | CHP[3] (Grams) | Sensitizer[4] (Grams) | Solubility Enhancer[5] (Grams) |
|---|---|---|---|---|---|
| G | 3 | 10 | — | 1.2 | — |
| H | 3.4 | 14.94 | 1.66 | 1.36 | 0.34 |
| I | 3.4 | 14.94 | 1.66 | 1.36 | 0.68 |

[1]Resin is a polyamic ethyl ester prepared by condensation of diethyl pyromellitate diacyl chloride with 4,4'-oxydianiline.
[2]NMP: N-methyl-2-pyrrolidone
[3]CHP: N-Cyclohexyl-2-pyrrolidinone
[4]Sensitizer: Triester formed by condensing naphthoquinone(1,2)diazide-(5)-sulfonic acid with 2,3,4-trihydroxybenzophenone.
[5]Solubility enhancer: Tris-(2-hydroxyethyl)isocyanurate Each formulation was coated on a silicone wafer which was treated with an aminopropyltriethoxysilane adhesion promoter by means of a spin coating process. The coated wafers were dried for 60 minutes at 90° C. in a convection oven to give a surface film having thickness of 3.0-3.5 μm. The dried wafers were then contact exposed through an Opto-Line multidensity resolution mask. The exposure unit was a Karl Suss contact printer. An exposure time of 30 seconds was used. The wafers were then immersion developed in an aqueous alkaline solution with conditions described in the following table. The wafers were rinse with deionized water and forced air dried. The results and process conditions are set forth in the following table:

| Example | Formulation | Developer[1] | Concentration (%) | Dev. Time (Min) | Clear Dose[2] (mJ/cm$^2$) | Image |
|---|---|---|---|---|---|---|
| 9 | G | TMAH 22° C. | 5 | 1 | 180 | No development |
| 10 | H | TMAH 40° C. | 5 | 2.5 | 216 | Clear |
| 11 | I | TMAH 40° C. | 5 | 2.0 | 216 | Clear |

[1]Developer: TMAH: Tetramethylammonium hydroxide
[2]Clear Dose is defined by the minimum UV energy to clear the complete film thickness The results clearly show the marked improvement in development which is achieved when the select additive is present in the resist composition in accordance with the present invention.

EXAMPLES 12-13

The resist solutions were prepared by dissolving diazo sensitizer, polyimide resin and solubility enhancer in a solvent mixture. The materials used and their concentrations are set forth in the following table:

| Formulation | Polyimide Resin[1] (Grams) | NMP[2] (Grams) | CHP[3] (Grams) | Sensitizer[4] (Grams) | Solubility Enhancer[5] (Grams) |
|---|---|---|---|---|---|
| J | 3.4 | 14.94 | 1.66 | 1.36 | 1.36 |
| K | 3.4 | 14.94 | 1.66 | 1.02 | 0.68 |

[1]Resin is a polyamic ethyl ester prepared by condensation of diethyl pyromellitate diacyl chloride with 4,4'-oxydianiline.
[2]NMP: N-methyl-2-pyrrolidone
[3]CHP: N-Cyclohexyl-2-pyrrolidinone
[4]Sensitizer: Triester formed by condensing naphthoquinone(1,2)diazide-(5)-sulfonic acid with 2,3,4-trihydroxybenzophenone.
[5]Solubility enhancer: 4,4'-Biphenol Each formulation was coated on a silicone wafer which was treated with an aminopropyltriethoxysilane adhesion promoter by means of a spin coating process. The coated wafers were dried for 20 minutes at 60° C. in a convection oven to give a surface film having thickness of 4.0-4.3 μm. The dried wafers were then contact exposed through an Opto-Line multidensity resolution mask. The exposure unit was a Karl Suss contact printer. An exposure time of 30 seconds was used. The wafers were then immersion developed in an aqueous alkaline solution with conditions described in the following table. The wafers were rinse with deionized water and forced air dried. The results and process conditions are set forth in the following table:

| Example | Formulation | Developer[1] | Concentration (%) | Dev. Time (Sec) | Clear Dose[2] (mJ/cm$^2$) | Image |
|---|---|---|---|---|---|---|
| 12 | J | TMAH 22° C. | 2.38 | 65 | 120 | Clear |
| 13 | K | TMAH 22° C. | 2.38 | 75 | 96 | Clear |

[1]Developer: TMAH: Tetramethylammonium hydroxide
[2]Clear Dose is defined by the minimum UV energy to clear the complete film thickness

EXAMPLE 14

A resist composition was prepared by dissolving diazo sensitizer, polyimide resin and solubility enhancer in a solvent mixture. Formulation for this solution is set forth in the following table:

| Formulation | Resin[1] (Grams) | NMP[2] (Grams) | CHP[3] (Grams) | Sensitizer[4] (Grams) | Solubility Enhancer[5] (Grams) |
|---|---|---|---|---|---|
| L | 12 | 38.08 | 9.52 | 4.2 | 4.2 |

[1]Resin is a polyamic ethyl ester prepared by condensation of diethyl pyromellitate diacyl chloride with 4,4'-oxydianiline.
[2]NMP: N-methyl-2-pyrrolidone
[3]CHP: N-cyclohexyl-2-pyrrolidinone
[4]Sensitizer: Triester formed by condensing naphthoquinone(1,2)diazide-(5)-sulfonic acid with 2,3,4-trihydroxybenzophenone.
[5]Solubility enhancer: Diphenylsilanediol The formulation was coated by means of a spin coating process on a silicone wafer which was treated with an aminopropyltriethoxysilane adhesion promoter. The coated wafers were dried for 1 minute at 105° C. on a hotplate to give a surface film having thickness of 9.4 μm. The dried wafers were then contact exposed through an Opto-Line multidensity resolution mask. The exposure unit was a Karl Suss contact printer. An exposure time of 35 seconds was used. The wafers were then spray developed for 100 seconds in a 2.38% by weight aqueous solution of tetramethylammonium hydroxide at 22° C. followed by rinse with deionized water and forced air dried to give a patterned photoresist layer.

EXAMPLE 15

A resist composition was prepared by dissolving diazo sensitizer, polyimide resin and solubility enhancer in a solvent mixture. Formulation for this solution is set forth in the following table:

| Formulation | Resin[1] (Grams) | NMP[2] (Grams) | CHP[3] (Grams) | Sensitizer[4] (Grams) | Solubility Enhancer[5] (Grams) |
|---|---|---|---|---|---|
| M | 12 | 36.72 | 9.18 | 4.8 | 4.8 |

[1]Resin is a polyamic ethyl ester prepared by condensation of diethyl pyromellitate diacyl chloride with 4,4'-oxydianiline.
[2]NMP: N-methyl-2-pyrrolidone
[3]CHP: N-Cyclohexyl-2-pyrrolidinone
[4]Sensitizer: Triester formed by condensing naphthoquinone(1,2)diazide-(5)-sulfonic acid with 2,3,4-trihydroxybenzophenone.
[5]Solubility enhancer: Diphenylsilanediol The formulation was coated by means of a spin coating process on a silicone wafer which was treated with an aminopropyltriethoxysilane adhesion promoter. The coated wafers were dried for 1 minute at 100° C. on a hotplate to give a surface film having thickness of 7.2 μm. The dried wafers were then contact exposed through an Opto-Line multidensity resolution mask. The exposure unit was a Karl Suss contact printer. An exposure time of 30 seconds was used. The wafers were then spray developed for 70 seconds in a 2.38% by weight aqueous solution of tetramethylammonium hydroxide at 22° C. followed by rinse with deionized water and forced air dried to give a patterned photoresist layer.

EXAMPLE 16

A resist composition was prepared by dissolving diazo sensitizer, polyimide resin and solubility enhancer in a solvent mixture. Formulation for this solution is set forth in the following table:

| Formulation | Resin[1] (Grams) | NMP[2] (Grams) | CHP[3] (Grams) | Sensitizer[4] (Grams) | Solubility Enhancer[5] (Grams) |
|---|---|---|---|---|---|
| M | 3 | 9.52 | 2.38 | 1.05 | 1.05 |

[1]Resin is a polyamic ethyl ester prepared by condensation of diethyl pyromellitate diacyl chloride with 4,4'-oxydianiline.
[2]NMP: N-methyl-2-pyrrolidone
[3]CHP: 1-Cyclohexyl-2-pyrrolidinone
[4]Sensitizer: Triester formed by condensing naphthoquinone(1,2)diazide-(5)-sulfonic acid with 2,3,4-trihydroxybenzophenone.
[5]Solubility enhancer: 2,2',4,4'-Tetrahydroxybenzophenone The formulation was coated by means of a spin coating process on a silicone wafer which was treated with an aminopropyltriethoxysilane adhesion promoter. The coated wafers were dried for 10 minutes at 90° C. in a convection oven to give a surface film having thickness of 7.6 μm. The dried wafers were then contact exposed through an Opto-Line multidensity resolution mask. The exposure unit was an Oriel G-line contact printer. An exposure time of 90 seconds was used. The wafers were then spray developed for 115 seconds in a 2.38% by weight aqueous solution of tetramethylammonium hydroxide at 22° C. followed by rinse with deionized water and forced air dried to give a patterned photoresist layer.

EXAMPLE 17

A resist composition was prepared by dissolving diazo sensitizer, polyimide resin and solubility enhancer in a solvent mixture. Formulation for this solution is set forth in the following table:

| Formulation | Resin[1] (Grams) | NMP[2] (Grams) | CHP[3] (Grams) | Sensitizer[4] (Grams) | Solubility Enhancer[5] (Grams) |
|---|---|---|---|---|---|
| N | 3 | 10.11 | 1.78 | 1.05 | 1.05 |

[1]Resin is a polyamic ethyl ester prepared by condensation of diethyl pyromellitate diacyl chloride with 4,4'-oxydianiline.
[2]NMP: N-methyl-2-pyrrolidone
[3]CHP: 1-Cyclohexyl-2-pyrrolidinone
[4]Sensitizer: Triester formed by condensing naphthoquinone(1,2)diazide-(5)-sulfonic acid with 2,3,4-trihydroxybenzophenone.
[5]Solubility enhancer: Oxalic acid The formulation was coated by means of a spin coating process on a silicone wafer which was treated with an aminopropyltriethoxysilane adhesion promoter. The coated wafers were dried for 10 minutes at 100° C. in a convection oven to give a surface film having thickness of 10.3 μm. The dried wafers were then contact exposed through an Opto-Line multidensity resolution mask. The exposure unit was a Karl Suss contact printer. An exposure time of 30 seconds was used. The wafers were then immersion developed for 5 minutes in a 5% by weight aqueous solution of tetramethylammonium hydroxide at 22° C. followed by rinse with deionized water and forced air dried to give a patterned photoresist layer.

EXAMPLE 18

A resist composition was prepared by dissolving diazo sensitizer, polyimide resin and solubility enhancer in a solvent mixture. Formulation for this solution is set forth in the following table:

| Formulation | Resin[1] (Grams) | NMP[2] (Grams) | CHP[3] (Grams) | Sensitizer[4] (Grams) | Solubility Enhancer[5] (Grams) |
|---|---|---|---|---|---|
| O | 3 | 10.11 | 1.78 | 1.05 | 1.05 |

[1]Resin is a polyamic ethyl ester prepared by condensation of diethyl pyromellitate diacyl chloride with 4,4'-oxydianiline.
[2]NMP: N-methyl-2-pyrrolidone
[3]CHP: 1-Cyclohexyl-2-pyrrolidinone
[4]Sensitizer: Triester formed by condensing naphthoquinone(1,2)diazide-(5)-sulfonic acid with 2,3,4-trihydroxybenzophenone.
[5]Solubility enhancer: Tetrabutylammonium hydrogen sulfate The formulation was coated by means of a spin coating process on a silicone wafer which was treated with an aminopropyltriethoxysilane adhesion promoter. The coated wafers were dried for 10 minutes at 100° C. in a convection oven to give a surface film having thickness of 7.1 μm. The dried wafers were then contact exposed through an Opto-Line multidensity resolution mask. The exposure unit was a Karl Suss contact printer. An exposure time of 30 seconds was used. The wafers were then immersion developed for 5 minutes in a 5% by weight aqueous solution of tetramethylammonium hydroxide at 22° C. followed by rinse with deionized water and forced air dried to give a patterned photoresist layer.

What is claimed is:

1. A positive photoresist composition comprising in admixture:
   (a) 100 parts by weight of a base polymer, the base polymer being substantially insoluble in alkaline media at a pH between 7 and 10;
   (b) 25-50 parts by weight of a quinonediazide acid generator, the acid generator being activatable by actinic radiation;
   (c) 25-50 parts by weight of a silanol, the silanol being non-volatile under 110° C., and soluble in alkaline media at a pH greater than 7.5; and
   (d) a common solvent to the base polymer, the acid generator and the silanol.

2. A composition as defined in claim 1, wherein the base polymer is selected from the group consisting of acrylic, methacrylic, polyester, polystyrene, polycarbonate, novolac resin, esterified epoxy, polyurethane, polyurea, and a mixture thereof.

3. A composition as defined in claim 2, wherein the silanol comprises diphenylsilanediol.

4. A positive photoresist composition comprising in admixture:
   (a) 100 parts by weight of a polyamic ethyl ester prepared by condensation of diethyl pyromellitate diacyl chloride with 4,4'-oxydianiline;
   (b) 30-40 parts by weight of an acid generator, the acid generator being a product of condensation of naphthoquinone-(1,2)diazide-(5)-sulfonic acid with 2,3,4-trihydroxybenzophenone.
   (c) 30-40 parts by weight of diphenylsilanediol; and
   (d) 350-450 parts by weight of a common solvent to the ethyl ester, the acid generator, and the diphenylsilanediol, the common solvent comprising N-methyl-2-pyrrolidone and N-cyclohexyl-2-pyrrolidone.

5. A positive photoresist composition comprising in admixture:
   (a) 100 parts by weight of a resin selected from the group consisting of a polyimide precursor and a polyimide, the resin being substantially insoluble in alkaline media at a pH between 7 and 10, but soluble at a level of at least 2% in at least one solvent selected from the group consisting of dimethylsulfoxide, diethylsulfoxide, N,N-dimethylformamide, N,N-diethylformamide, N,N-dimethylacetamide, N,N-diethylacetamide, N-cyclohexyl-2-pyrrolidone, 1,3-dimethyl-2-imidazolidione, N-methyl-2-pyrrolidone, phenol, o-, m-, p-cresol, xylenol, halogenated phenol, catechol, hexamethylphosphoramide, γ-butyrolactone, chloroform, tetrachloroethane and a mixture thereof;
   (b) 25 to 50 parts by weight of a quinonediazide acid generator, the acid generator being activatable by actinic radiation;
   (c) 25 to 50 parts by weight of a silanol solubility enhancer, the solubility enhancer being substantially non-volatile under 110° C., and soluble in alkaline media at a pH greater than 7.5; and
   (d) a common solvent to the resin, the acid generator and the silanol solubility enhancer, with the proviso that a 5 micrometer thick film of the photoresist composition on a silicon wafer, which film has been baked at 100° C. for ½ hour, dissolves in less than 5 minutes in a 2.4% by weight solution of tetramethylammonium hydroxide in water.

6. A composition as defined in claim 5, wherein the silanol comprises diphenylsilanediol.

* * * * *